United States Patent
Wei et al.

(10) Patent No.: US 10,535,719 B2
(45) Date of Patent: Jan. 14, 2020

(54) COLOR FILM SUBSTRATE FOR WOLED DISPLAY AND WOLED DISPLAY

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Feng Wei, Guangdong (CN); Yang Liu, Guangdong (CN); Jinchuan Li, Guangdong (CN)

(73) Assignee: SHENZHEN CHINA STAR OPTOELECTRONICS SEMICONDUCTORS DISPLAY TECHNOLOGY CO., LTD., Shenzhen (CN)

( * ) Notice: Subject to any disclaimer, the term of this patent is extended or adjusted under 35 U.S.C. 154(b) by 170 days.

(21) Appl. No.: 15/754,438

(22) PCT Filed: Jan. 24, 2018

(86) PCT No.: PCT/CN2018/074021
§ 371 (c)(1),
(2) Date: Feb. 22, 2018

(87) PCT Pub. No.: WO2019/127790
PCT Pub. Date: Jul. 4, 2019

(65) Prior Publication Data
US 2019/0386067 A1   Dec. 19, 2019

(30) Foreign Application Priority Data

Dec. 29, 2017 (CN) .......................... 2017 1 1480150

(51) Int. Cl.
H01L 27/32    (2006.01)
H01L 51/52    (2006.01)

(52) U.S. Cl.
CPC ........ *H01L 27/322* (2013.01); *H01L 27/3246* (2013.01); *H01L 27/3258* (2013.01); *H01L 51/5271* (2013.01)

(58) Field of Classification Search
CPC ............... H01L 27/322; H01L 27/3246; H01L 27/3251; H01L 27/3258; H01L 51/5271
See application file for complete search history.

(56) References Cited

U.S. PATENT DOCUMENTS

2004/0113550 A1* 6/2004 Adachi ................. H01L 51/525
                                                                 313/512

* cited by examiner

*Primary Examiner* — Hoai V Pham
(74) *Attorney, Agent, or Firm* — Hemisphere Law, PLLC; Zhigang Ma

(57) ABSTRACT

The disclosure provides a color film substrate for a WOLED display, comprising: a first substrate; a plurality of color photoresist layers are provided on the first substrate, and the color photoresist layers are set at intervals between each other; a first pixel definition layer is provided within an interval; a reflective film layer is provided on the first pixel definition layer. The disclosure further provided the WOLED display. the reflective film layer is formed at the junction of the color film substrate and the driving light-emitting substrate, so as to prevent an emitting light of each OLED functional layer from leaking to each adjacent OLED functional layer, and avoid the phenomenon of the light leakage and the color mixing between adjacent OLED functional layers.

13 Claims, 1 Drawing Sheet

COLOR FILM SUBSTRATE FOR WOLED DISPLAY AND WOLED DISPLAY

RELATED APPLICATIONS

The present application is a National Phase of International Application Number PCT/CN2018/074021, filed Jan. 24, 2018, and claims the priority of China Application No. 201711480150.7, filed Dec. 29, 2017.

FIELD OF THE DISCLOSURE

The disclosure relates to an organic display technical field, and specifically to a color film substrate for a WOLED display and the WOLED display.

BACKGROUND

In recent years, Organic Light-Emitting Diode (OLED) displays have become very popular in emerging flat panel displays both at home and abroad, this is because OLED displays have characteristics of self-luminous, wide viewing angle, short reaction time, high luminous efficiency, wide color gamut, thin thickness, large size and flexible display and simple manufacturing process and so on, and have a potential of low cost.

OLED display in accordance with a color classification can be divided into three ways which are RGBOLED, WOLED+color filter, and BOLED+color change layer; wherein, a way of a RGBOLED uses an independent luminescent material to manufacture a RGB three-color organic light-emitting layer, with a characteristic of a luminous efficiency, do not need to add a color filter or a film of a color change layer, however, a RGBOLED three-color process uses a shadow mask vapor deposition which a high-precision pixel for a requirement of a process precision is high; the way of a BOLED+color change layer uses a blue light-emitting material to manufacture the organic light-emitting layer, when emitting a light, the film of the color change layer is set in a middle, and a device of the luminous efficiency is not as good as a RGBOLED mode, and an efficiency of a BOLED, life and other issues are also very detrimental to the development of this technology; the way of a WOLED use a white light-emitting material to manufacture an organic light-emitting layer, and the color filter is added in the middle, the luminous efficiency is not as good as the RGBOLED way, but the use of an open mask evaporation method, which the process is simple. Therefore, a current mainstream technology is to develop the technology of the RGBOLED and the WOLED+color filter.

In the technology of a WOLED+color filter, the device of the WOLED (that is, white light OLED) is first prepared, and then three primary colors are acquired through the color filter, and the three primary colors are combined to realize a colorization, and a key point of this technology is to acquire a high efficiency of a white light and a good choose of the color filter, the color filter will inevitably cause a light loss, but WOLED does not need a high precision shadow mask, and then a color filter technology is mature in an application of a LCD production technology, so the technology of the WOLED+color filter is large-size full-color OLED display production which the potential of the technology is the largest. WOLED device has two structures which are a top emission device and a bottom emission device, with a large-size high-resolution OLED display requirement, the top emission due to a pixel aperture ratio is good and beneficial to realizing a high resolution, so a top emission WOLED device is a development of a mainstream in a technical direction. However, in a manufacturing a process of the top emission WOLED device, a distance between a light-emitting sub-pixel and a light-emitting area of a cover plate is short, so an adjacent light-emitting sub-pixel has a problem and a risk of a light leakage and a color mixing.

SUMMARY

In order to solve an above problem of the prior art, a purpose of the present disclosure is to provide a color film substrate for a WOLED display and the WOLED display that eliminate problems of a color mixing and a light leakage between adjacent OLED functional layers in the WOLED display.

According to an aspect of the present disclosure, there is provided the color film substrate for the WOLED display, comprising: a first substrate; a plurality of color photoresist layers provided on the first substrate, and an interval set between the color photoresist layers; a first pixel definition layer is provided within the interval; and a reflective film layer is provided on the first pixel definition layer.

Further, the reflective film layer covers an upper surface and a side surface of the first pixel definition layer, the upper surface is a surface of the first pixel definition layer facing away from the first substrate, and the side surface is a surface of the first pixel definition layer extending from the upper surface to the surface of the color photoresist layer.

Further, an angle between the upper surface and the side surface of the first pixel definition layer is 120°~150°.

Further, the reflective film layer is made of an aluminum or a silver, and the reflective film has a thickness of 50~100 nm.

Further, the plurality of color photoresists comprises a plurality of red photoresists, a plurality of green photoresists and a plurality of blue photoresists.

According to another aspect of the present disclosure, it further provides the WOLED display device, comprising a light-emitting driving substrate and the color film substrate; and the light-emitting driving substrate comprising: a second substrate; a thin film transistor provided on a surface of the second substrate facing the reflective film layer; a planarization layer provided on the thin film transistor; an anode provided on the planarization layer and penetrates the planarization layer to connect with the thin film transistor; a second pixel definition layer provided on the planarization layer having pixel definition holes to expose an anode, the pixel definition holes being opposite to the corresponding color photoresist layers; an OLED functional layer provided on the exposed anode; a cathode provided on the second pixel definition layer and the OLED functional layer.

Further, the thin film transistor comprises: an active layer provided on the surface of the second substrate facing the reflective film layer; a first insulating layer provided on the active layer; a gate provided on the first insulating layer; a second insulating layer provided on the gate; the active layer and a substrate; a source electrode and a drain electrode provided on the second insulating layer and respectively penetrate the second insulating layer to connect with the active layer; wherein the planarization layer provided on the source electrode, the drain electrode, and the second insulation layer; and the anode penetrate the planarization layer to connect with the drain electrode.

Further, the OLED functional layer in order from the anode to the cathode comprises, a hole generation layer, a hole transport layer, an organic light-emitting layer, an electron transport layer and an electron injection layer.

Further, the WOLED display further comprises: an insulating protective layer provided on the cathode; wherein the reflective film layer on the upper surface of the first pixel definition layer of the color film substrate is provided on the insulating protective layer on the second pixel definition layer.

Further, the cathode is transmissive and the anode is reflective.

The beneficial effects of the present disclosure are as follows: in the present disclosure, the reflective film layer is formed at the junction of the color film substrate and the driving light-emitting substrate, so as to prevent an emitting light of each OLED functional layer from leaking to each adjacent OLED functional layer, and avoid a phenomenon of a light leakage and a color mixing between adjacent OLED functional layers.

BRIEF DESCRIPTION OF THE DRAWINGS

An above and other aspects, features and advantages of embodiments of the present disclosure will become more apparent from a following description taken in conjunction with accompanying figures, in which.

DETAILED DESCRIPTION OF PREFERRED EMBODIMENTS

Hereinafter, embodiments of the present disclosure will be described in detail with reference to the accompanying figures. However, the disclosure may be embodied in many different forms and should not be construed as limited to the specific embodiments set forth herein. Rather, these embodiments are provided to explain principles of the disclosure and its practical application to thereby enable those of ordinary skill in the art to understand various embodiments of the disclosure and various modifications as are suited to the particular use contemplated.

In the figures, a thickness of layers and regions is exaggerated for clarity. A same reference numbers indicate same components throughout the specification and the figures.

It will be understood that when an element such as a layer, a film, a region, or a substrate is referred to as being "on" another element, it can be directly on the other element or intervening elements may also be present. Alternatively, when an element is referred to as being "directly on" another element, there are no intervening elements present.

Figure 1:
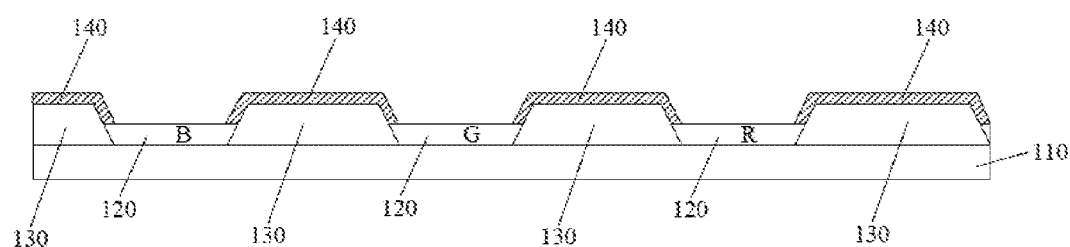
FIG. 1 is a schematic structural view of a color film substrate for a WOLED display according to an embodiment of the present disclosure.

FIG. 1 is a schematic structural view of a color film substrate for a WOLED display according to an embodiment of the present disclosure. In FIG. 1, only three colored photoresist layers are shown, but the present disclosure is not limited thereto. It should be understood that in the WOLED display, a plurality of color photoresist layers may be provided according to actual needs.

See FIG. 1, a color film substrate 100 for the WOLED display according to an embodiment of the present disclosure comprises: a first substrate 110, three color photoresist layers 120, a first pixel definition layer 130, and a reflective film layer 140.

In this embodiment, the three color photoresist layers 120 are a red photoresist layer R, a green photoresist layer G and a blue photoresist layer B, respectively, but the present disclosure is not limited thereto. For example, the plurality of color photoresist layers 120 is provided according to the actual needs may comprises the plurality of red photoresist layers R, the plurality of green photoresist layers G, and the plurality of blue photoresist layers B. That is, a number of the red photoresist layer R, the green photoresist layer G and the blue photoresist layer B is also set according to the actual needs.

Three color photoresist layers 120 are provided on the first substrate 110, and an interval set between an adjacent color photoresist layers 120. The first pixel definition layer 130 is provided within the interval. The reflective film layer 140 is provided on the first pixel definition layer 130, and a specific function will be described below.

Further, the reflective film layer 140 covers an upper surface and a side surface of the first pixel definition layer 130, At here, the upper surface of the first pixel definition layer 130 is a surface of the first pixel definition layer 130 facing away from the first substrate 110, or the upper surface of the first pixel definition layer 130 is the surface of the first pixel definition layer 130 opposite to a bottom surface of the first pixel definition layer 130 provided on the first substrate 110; and the side surface is a surface of the first pixel definition layer 130 penetrating the upper surface of the first pixel definition layer 130 to the surface of the color photoresist layer 120, and the specific function will be described below.

In addition, in this embodiment, preferably, the reflective film layer 140 is further made of an aluminum or a silver, but the present disclosure is not limited thereto, and may be made of other materials with high reflectivity, for example. And a thickness of the reflective film layer 140 is 50~100 nm, but the present disclosure is not limited thereto.

In addition, an angle between the upper surface and the side surface of the first pixel definition layer 130 is 120°~150°, that is, the angle between the side surface and the bottom surface of the first pixel definition layer 130 is 30°~60°.

Figure 2:
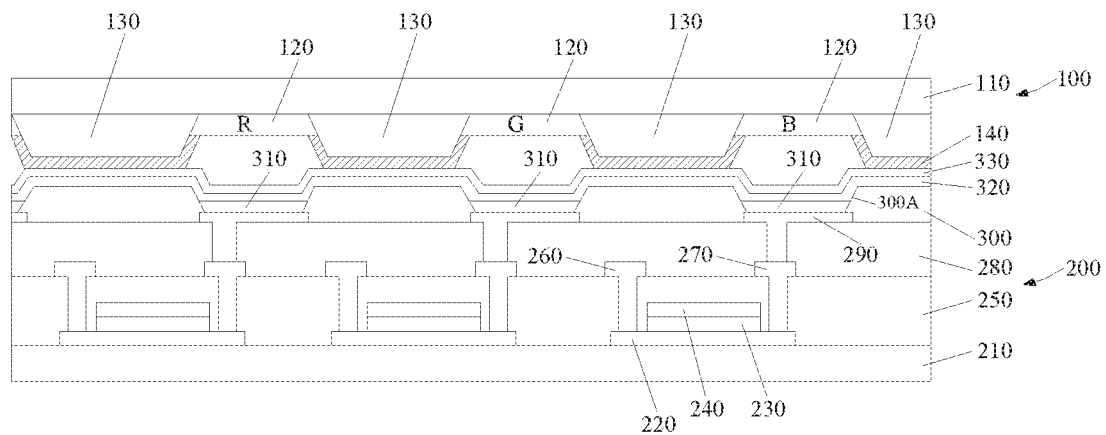
FIG. 2 is a schematic structural view of a WOLED display according to an embodiment of the present disclosure.

Hereinafter, the WOLED display of the color film substrate 100 described above applied will be described in detail. FIG. 2 is a schematic structural view of a WOLED display according to the embodiment of the present disclosure.

See FIG. 2, the WOLED display according to the embodiment of the present disclosure comprises the color film substrate 100 and a light-emitting driving substrate 200, wherein, the color film substrate 100 and the light-emitting driving substrate 200 are opposite to the surface, that is, the surfaces of both film-forming layers are opposite.

Specifically, the driving light-emitting substrate 200 comprises: a second substrate 210, an active layer 220, a first insulating layer 230, a gate 240, a second insulating layer 250, a source electrode 260, a drain electrode 270, a planarization layer 280, an anode 290, a second pixel definition layer 300, an OLED functional layer 310, a cathode 320, and an insulating protective layer 330.

Specifically, the active layer 220 is provided on the second substrate 210. The active layer 220 may be made of, for example, a material such as an amorphous silicon, a low-temperature polysilicon, an IGZO, and so on, but the present disclosure is not limited thereto. The first insulating layer 230 is provided on the active layer 220. The gate 240 is provided on the first insulating layer 230. The second insulating layer 250 is provided on the gate 240, the active layer 220 and the substrate 100. The source electrode 260 and the drain electrode 270 are provided on the second insulating layer 250 and respectively penetrates the second insulating layer 250 to connect with the active layer 220.

At here, a thin film transistor according to the embodiment of the present disclosure is constituted by the active layer 220, the first insulating layer 230, the gate electrode 240, the second insulating layer 250, the source electrode 260, and the drain electrode 270, and a structure of the thin film transistor is only one embodiment of the present disclosure, the structure of the thin film transistor of the present disclosure is not limited thereto. In addition, in this embodiment, three thin film transistors are shown, but the present disclosure is not limited thereto.

The planarization layer 280 is provided on the second insulating 250, the source electrode 260 and the drain electrode 270. The anode 290 is provided on the planarization layer 280 and penetrates the planarization layer 280 to connect with the drain electrode 270. In this embodiment, the anode 290 has high reflectivity.

The second pixel definition layer 300 is provided on the anode 290 and the planarization layer 280. The second pixel definition layer 300 has a pixel definition hole 300A with an exposed anode 290 therein.

The OLED functional layer 310 is provided on the exposed anode 290. In addition, the OLED functional layer 310 emits a white light. As the embodiment of the present disclosure, the OLED functional layer 310 in order from the anode to the cathode comprises, a hole generation layer, a hole transport layer, an organic light-emitting layer, an electron transport layer and an electron injection layer; but; the structure of the OLED functional layer 310 of the present disclosure is not limited thereto. In this embodiment, three OLED functional layers 310 are shown, and one OLED functional layer 310 corresponds to one color photoresist 120. In addition, one OLED functional layer 310, one color photoresist 120 and a circuit device such as the thin film transistor that drives the OLED functional layer 310 to emit the light may be referred to as one sub-pixel. It should be noted that although one thin film transistor corresponding to one OLED functional layer 310 is shown in FIG. 2, but the present disclosure is not limited thereto, for example, two, three, or more thin film transistors for driving the OLED functional layer 310 need to be specifically considered about a driving circuit architecture.

The cathode 320 is provided on the second pixel definition layer 300 and the OLED functional layer 310. In this embodiment, the cathode 320 has high light transmittance, but the present disclosure is not limited thereto. The insulating protective layer 330 is provided on the cathode 320.

After the color film substrate 100 and the light-emitting driving substrate 200 are provided on an opposite side, the insulating protective layer 330 is located between the cathode 310 and the reflective film layer 140 to separate the cathode 310 and the reflective film layer 140.

In this way, the light emitted by one OLED functional layer 310 is reflected by the reflective film layer 140 and can not reach the adjacent OLED functional layer 310, thereby avoiding the phenomenon of a light leakage and a color mixing by the adjacent OLED functional layer 310. Further, the reflective film layer 140 can also reflect light emitting by the OLED functional layer 310 without being used for a light-emitting display so that it can be re-reflected by the anode 290 as a display light, so as to improve a light utilization efficiency.

In summary, according to the embodiments of the present disclosure, the reflective film layer is formed at the junction of the color film substrate and the driving light-emitting substrate, so as to prevent an emitting light of each OLED functional layer from leaking to each adjacent OLED functional layer, and avoid the phenomenon of the light leakage and the color mixing between adjacent OLED functional layers.

Although the disclosure has been shown and described with reference to specific embodiments, those skilled in the art will understand that: various changes in form and detail may be made therein without departing from the spirit and scope of the disclosure as defined by the appended claims and their equivalents.

What is claimed is:

1. A color film substrate for a WOLED display; comprising:
    a first substrate;
    a plurality of color photoresist layers provided on the first substrate, and an interval set between the color photoresist layers;
    a first pixel definition layer provided within the interval; and
    a reflective film layer provided on the first pixel definition layer.

2. The color film substrate according to claim 1, wherein the reflective film layer covers an upper surface and a side surface of the first pixel definition layer, the upper surface is a surface of the first pixel definition layer facing away from the first substrate, and the side surface is a surface of the first pixel definition layer extending from the upper surface to the color photoresist layer.

3. The color film substrate according to claim 2, wherein an angle between the upper surface and the side surface of the first pixel definition layer is 120°~150°.

4. The color film substrate according to claim 2, wherein the reflective film layer is made of an aluminum or a silver, and the reflective film has a thickness of 50~100 nm.

5. The color film substrate according to claim 1, wherein the reflective film layer is made of aluminum or silver, and the reflective film has a thickness of 50~100 nm.

6. The color film substrate according to claim 1, wherein the plurality of color photoresists comprise a plurality of red photoresists, a plurality of green photoresists and a plurality of blue photoresists.

7. A WOLED display device, comprising a light-emitting driving substrate and a color film substrate according to claim 1, wherein the light-emitting driving substrate comprises:
    a second substrate;
    a thin film transistor provided on a surface of the second substrate facing a reflective film layer;
    a planarization layer provided on the thin film transistor;
    an anode provided on the planarization layer and penetrating the planarization layer to connect with the thin film transistor;
    a second pixel definition layer provided on the planarization layer having pixel definition holes to expose an anode, the pixel definition holes being opposite to the corresponding color photoresist layers;
    an OLED functional layer provided on the exposed anode;
    a cathode provided on the second pixel definition layer and the OLED functional layer.

8. The WOLED display device according to claim 7, wherein the thin film transistor comprises:
    an active layer provided on the surface of the second substrate facing the reflective film layer;
    a first insulating layer provided on the active layer;
    a gate provided on the first insulating layer;
    a second insulating layer provided on the gate, the active layer and the second substrate;

a source electrode and a drain electrode provided on the second insulating layer and respectively penetrating the second insulating layer to connect with the active layer;

wherein the planarization layer is provided on the source electrode, the drain electrode, and the second insulation layer, and the anode penetrated the planarization layer to connect with the drain electrode.

9. The WOLED display device according to claim 7, wherein the OLED functional layer in order from the anode to the cathode comprises a hole generation layer, a hole transport layer, an organic light-emitting layer, an electron transport layer and an electron injection layer.

10. The WOLED display device according to claim 9, wherein the cathode is transmissive and the anode is reflective.

11. The WOLED display device according to claim 7, wherein the WOLED display further comprises an insulating protective layer provided on the cathode.

12. The WOLED display device according to claim 7, wherein the cathode is transmissive and the anode is reflective.

13. The WOLED display device according to claim 7, wherein the reflective film layer covers an upper surface and a side surface of the first pixel definition layer, the upper surface is a surface of the first pixel definition layer facing away from the first substrate, and the side surface is a surface of the first pixel definition layer extending from the upper surface to the color photoresist layer.

* * * * *